(12) United States Patent
Li

(10) Patent No.: US 11,977,744 B2
(45) Date of Patent: May 7, 2024

(54) MEMORY ANOMALY PROCESSING METHOD AND SYSTEM, ELECTRONIC DEVICE, AND STORAGE MEDIUM

(71) Applicant: INSPUR SUZHOU INTELLIGENT TECHNOLOGY CO., LTD., Jiangsu (CN)

(72) Inventor: Shuangqing Li, Jiangsu (CN)

(73) Assignee: INSPUR SUZHOU INTELLIGENT TECHNOLOGY CO., LTD., Jiangsu (CN)

(*) Notice: Subject to any disclaimer, the term of this patent is extended or adjusted under 35 U.S.C. 154(b) by 57 days.

(21) Appl. No.: 17/789,953

(22) PCT Filed: Aug. 21, 2020

(86) PCT No.: PCT/CN2020/110362
§ 371 (c)(1),
(2) Date: Jun. 29, 2022

(87) PCT Pub. No.: WO2021/135272
PCT Pub. Date: Jul. 8, 2021

(65) Prior Publication Data
US 2022/0391103 A1 Dec. 8, 2022

(30) Foreign Application Priority Data
Dec. 29, 2019 (CN) .......................... 201911386480.9

(51) Int. Cl.
*G06F 3/06* (2006.01)
(52) U.S. Cl.
CPC .......... *G06F 3/0619* (2013.01); *G06F 3/0629* (2013.01); *G06F 3/0659* (2013.01); *G06F 3/0673* (2013.01)

(58) Field of Classification Search
CPC ...... G06F 11/27; G06F 3/0629; G06F 3/0619; G06F 3/0659
See application file for complete search history.

(56) References Cited

U.S. PATENT DOCUMENTS 6,370,604 B1* 4/2002 Sreekanti ............ G06F 13/4081
710/39
2003/0070055 A1 4/2003 Johnson et al.
(Continued)

FOREIGN PATENT DOCUMENTS

| CN | 101359306 A | 2/2009 |
| CN | 102637155 A | 8/2012 |

(Continued)

OTHER PUBLICATIONS

International Search Report of corresponding PCT application PCT/CN2020/110362, dated Nov. 25, 2022, 5 pages.
(Continued)

*Primary Examiner* — Kamini B Patel
(74) *Attorney, Agent, or Firm* — Cooper Legal Group LLC

(57) ABSTRACT

A memory anomaly processing method and system, an electronic device, and a storage medium. The method includes: reading a memory error quantity of a target memory bank from a memory error register; when the memory error quantity is greater than a preset value, executing a hot-removal operation on the target memory bank; calculating a memory delay parameter, and writing the memory delay parameter into a memory controller, wherein the memory delay parameter is waiting time after the memory controller controls the target memory bank to receive a read/write command; and executing a hot-addition operation on the target memory bank, whereby the memory controller continues to execute a read/write operation on the target memory bank based on the memory delay parameter.

(Continued)

It can be seen that, according to the present application, the memory read/write error rate may be reduced.

17 Claims, 2 Drawing Sheets

(56) References Cited

U.S. PATENT DOCUMENTS

| | | | | |
|---|---|---|---|---|
| 2003/0167367 | A1* | 9/2003 | Kaushik | G06F 13/4081 |
| | | | | 710/302 |
| 2007/0226703 | A1* | 9/2007 | Sharapov | G06F 12/0862 |
| | | | | 711/E12.057 |
| 2009/0119533 | A1 | 5/2009 | Kim et al. | |
| 2014/0201477 | A1* | 7/2014 | Greenfield | G06F 12/023 |
| | | | | 711/158 |
| 2016/0019160 | A1* | 1/2016 | Mohan | G06F 12/0246 |
| | | | | 711/208 |
| 2017/0192862 | A1* | 7/2017 | Xia | G06F 11/2033 |
| 2018/0069692 | A1* | 3/2018 | Morris | H04L 7/0331 |
| 2021/0073173 | A1* | 3/2021 | Hayes | G06F 16/11 |

FOREIGN PATENT DOCUMENTS

| | | |
|---|---|---|
| CN | 105608034 A | 5/2016 |
| CN | 106445720 A | 2/2017 |
| CN | 107301103 A | 10/2017 |
| CN | 110428856 A | 11/2019 |
| CN | 111143104 A | 5/2020 |

OTHER PUBLICATIONS

Written Opinion of corresponding PCT application PCT/CN2020/110362, dated Nov. 25, 2022, 9 pages.

Ji, Ke "Huawei KunLun minicomputer makes In-Memory applications last", https://cloud.tencent.com/developer/news/174559, Apr. 11, 2018, 7 pages.

First Office Action cited in CN201911386480.9, dated Feb. 9, 2021, 12 pages.

Second Office Action cited in CN201911386480.9, dated Jul. 21, 2021, 12 pages.

* cited by examiner

MEMORY ANOMALY PROCESSING METHOD AND SYSTEM, ELECTRONIC DEVICE, AND STORAGE MEDIUM

This application claims priority to Chinese Patent Application No. 201911386480.9, filed on Dec. 29, 2019, in China National Intellectual Property Administration and entitled "Memory Anomaly Processing Method and System, Electronic Device, and Storage medium", the contents of which are hereby incorporated by reference in its entirety.

FIELD

The present application relates to the technical field of computers, and particularly to a memory anomaly processing method and system, an electronic device, and a storage medium.

BACKGROUND

With the development of computer technologies, requirements for stability and reliability of servers have increased, and operating frequencies of memories have also increased. Higher frequencies are more likely to cause signal errors under interferences, resulting in errors in the memories of the servers and reduction in reliability. Memory error may simply be divided into two types: Correct Error (CE) and Uncorrect Error (UCE). A UCE causes a data read/write error of software. A CE may be corrected by calculation with an algorithm, but may reduce the system performance. Moreover, a persistent CE may develop into a UCE to cause a data read/write error of software and even outage.

Therefore, how to reduce the memory read/write error rate is a technical problem needed to be solved by those skilled in the art currently.

SUMMARY

An objective of the present application is to provide a memory anomaly processing method and system, an electronic device, and a storage medium, which may reduce the memory read/write error rate.

In order to solve the foregoing technical problem, the present application provides a memory anomaly processing method, including:

reading a memory error quantity of a target memory bank from a memory error register;

when the memory error quantity is greater than a preset value, executing a hot-removal operation on the target memory bank;

calculating a memory delay parameter, and writing the memory delay parameter into a memory controller, wherein the memory delay parameter is waiting time after the memory controller controls the target memory bank to receive a read/write command;

executing a hot-addition operation on the target memory bank, whereby the memory controller continues to execute a read/write operation on the target memory bank based on the memory delay parameter.

Optionally, after the executing a hot-addition operation on the target memory bank, the method further includes:

by the target memory bank, receiving a new read/write command sent by the memory controller, and feeding back a Ready signal to the memory controller after a time delay corresponding to the memory delay parameter, whereby the memory controller executes the read/write operation on the target memory bank after receiving the Ready signal.

Optionally, the executing a hot-removal operation on the target memory bank includes:

pulling down a level of a first General Purpose Input/Output (GPIO) pin to remove an address space where the target memory bank is located from an Operating System (OS), so as to set a state of the target memory bank to unavailable.

Optionally, the executing a hot-addition operation on the target memory bank includes:

pulling down a level of a second GPIO pin to add an address space where the target memory bank is located to an OS, so as to recover a state of the target memory bank to available.

Optionally, the writing the memory delay parameter into a memory controller includes:

reading/writing the memory controller through a Platform Environment Control Interface (PECI) bus to write the memory delay parameter into a register of the memory controller.

Optionally, the target memory bank is a Double Data Rate (DDR) 4 memory bank or a DDR3 memory bank.

Optionally, the calculating a memory delay parameter includes: acquiring a Memory Reference Code (MRC) in a boot process of a Basic Input/Output System (BIOS), and calculating the memory delay parameter according to the MRC.

The present application also provides a memory anomaly processing system, including:

an error quantity reading module, configured to read a memory error quantity of a target memory bank from a memory error register; a memory hot-removal module, configured to, when the memory error quantity is greater than a preset value, execute a hot-removal operation on the target memory bank;

a parameter setting module, configured to calculate a memory delay parameter, and write the memory delay parameter into a memory controller, wherein the memory delay parameter is waiting time after the memory controller controls the target memory bank to receive a read/write command; and a memory hot-addition module, configured to execute a hot-addition operation on the target memory bank, whereby the memory controller continues to execute a read/write operation on the target memory bank based on the memory delay parameter.

The present application also provides a storage medium, having a computer program stored thereon, which when executed implements the steps of the memory anomaly processing method.

The present application also provides an electronic device, including a storage device and a processor. The storage device stores a computer program. The processor calls the computer program in the storage device to implement the steps of the memory anomaly processing method.

The present application provides a memory anomaly processing method, including: reading a memory error quantity of a target memory bank from a memory error register; when the memory error quantity is greater than a preset value, executing a hot-removal operation on the target memory bank; calculating a memory delay parameter, and writing the memory delay parameter into a memory controller, wherein the memory delay parameter is waiting time after the memory controller controls the target memory bank to receive a read/write command; and executing a hot-addition operation on the target memory bank, whereby the memory controller continues to execute a read/write operation on the target memory bank based on the memory delay parameter.

According to the present application, when the memory error quantity of the target memory bank in the memory error register is greater than the preset value, the memory delay parameter is recalculated, and the recalculated memory delay parameter is written into the memory controller, whereby the memory controller continues to execute the read/write operation on the target memory bank. The memory delay parameter is waiting time after the memory controller controls the target memory bank to receive a read/write command However, practically needed waiting time after the target memory bank receives a read/write command changes under the influence of a temperature, a humidity, and a memory state. When the practically needed waiting time increases while the memory delay parameter in the memory controller remains unchanged, the memory error quantity may increase. Therefore, in the present application, recalculating and setting the memory delay parameter may reduce memory read/write errors caused by inadequate waiting time to further reduce the memory read/write error rate. The present application also provides a memory anomaly processing system, an electronic device, and a storage medium, which have the foregoing beneficial effects. Elaborations are omitted herein.

BRIEF DESCRIPTION OF THE DRAWINGS

In order to describe the technical solutions in the embodiments of the present application or the conventional art more clearly, the drawings needed to be used in descriptions about the embodiments or the conventional art will be simply introduced below. It is apparent that the drawings described below are merely some embodiments of the present application. Other drawings may further be obtained by those of ordinary skill in the art according to these drawings without creative work.

DETAILED DESCRIPTION

In order to make the objective, technical solutions, and advantages of the embodiments of the present application clearer, the technical solutions in the embodiments of the present application will be described clearly and completely below in combination with the drawings in the embodiments of the present application. Based on the embodiments of the present application, all other embodiments obtained by those skilled in the art without creative work shall fall within the protection scope of the present application.

Figure 1:
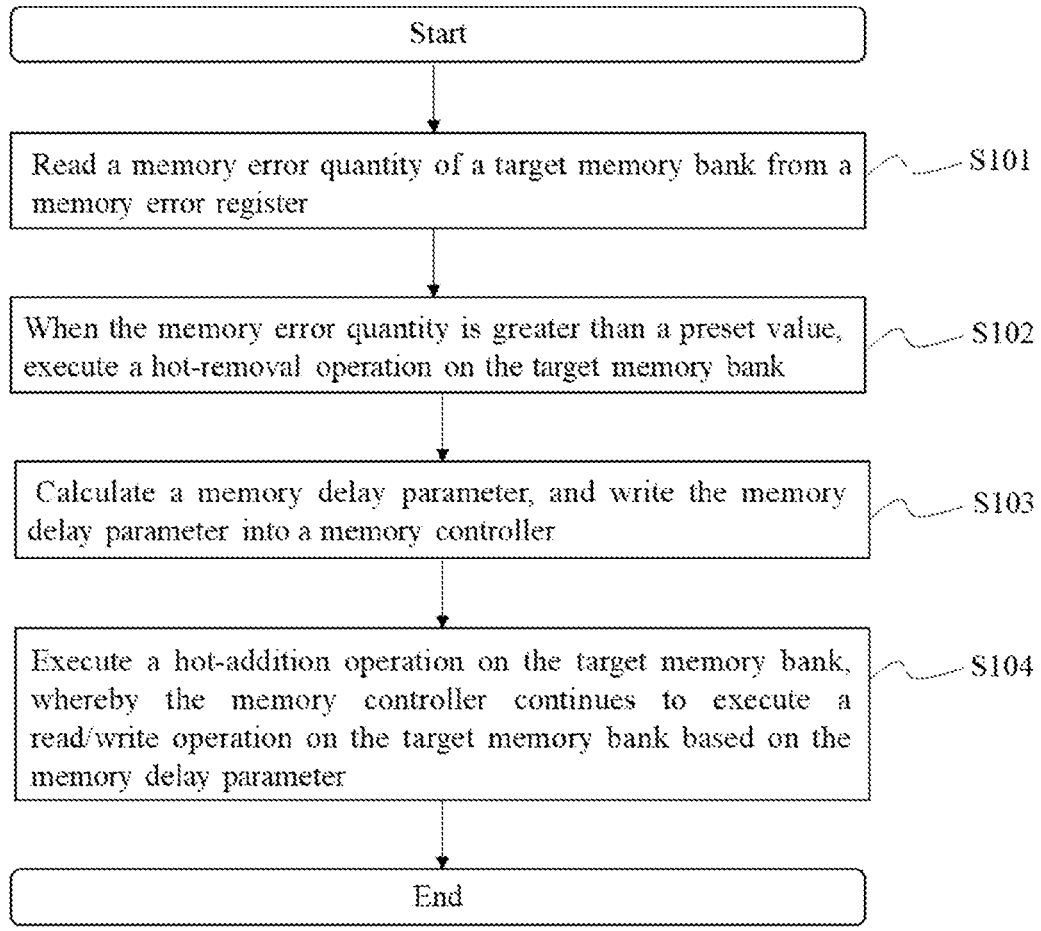
FIG. 1 is a flowchart of a memory anomaly processing method according to an embodiment of the present application.

References are made to FIG. 1 below. FIG. 1 is a flowchart of a memory anomaly processing method according to an embodiment of the present application.

The following specific steps may be included.

S101: read a memory error quantity of a target memory bank from a memory error register.

A memory error quantity of each memory bank may be stored in the memory error register. Specifically, the memory error quantity mentioned in this step may include the quantity of memory read/write CEs. In the present embodiment, a type of the target memory bank is not limited, and the target memory bank may specifically be a DDR4 memory bank or a DDR3 memory bank.

S102: when the memory error quantity is greater than a preset value, execute a hot-removal operation on the target memory bank.

In the present embodiment, a threshold about whether a hot-removal operation is needed, i.e., the preset value in this step, may be preset. When the memory error quantity of the target memory bank is greater than the preset value, it indicates that there have been enough read/write errors in the target memory bank, and the occurrence of any more read/write error in the target memory bank may cause crash. Therefore, the hot-removal operation may be executed on the target memory bank in such case.

Specifically, in the present embodiment, a level of a first GPIO pin may be pulled down to remove an address space where the target memory bank is located from an OS, so as to set a state of the target memory bank to unavailable.

S103: calculate a memory delay parameter, and write the memory delay parameter into a memory controller.

A cause for a read/write error of a memory bank is that time corresponding to a memory delay parameter of a memory controller is shorter than practically needed waiting time after the target memory bank receives a read/write command Therefore, to avoid the occurrence of any more memory read/write error, in the present embodiment, a state of the target memory bank is set to unavailable first, and then a memory delay parameter is recalculated and written into the memory controller. In the present embodiment, the memory delay parameter written into the memory controller is waiting time after the memory controller controls the target memory bank to receive a read/write command.

As a possible implementation mode, the operation in the present embodiment that a memory delay parameter is calculated may include that: an MRC in a boot process of a BIOS is acquired, and the memory delay parameter is calculated according to the MRC. The MRC refers to Memory Reference Code. The BIOS includes the MRC. The MRC consists of a series of steps of reading/writing the memory controller.

As another possible implementation mode, in the present embodiment, the memory controller may be read/written through a PECI bus to write the memory delay parameter into a register of the memory controller.

S104: execute a hot-addition operation on the target memory bank, whereby the memory controller continues to execute a read/write operation on the target memory bank based on the memory delay parameter.

This step is based on that the memory delay parameter has been written into the memory controller. After a hot-addition operation is executed on the target memory bank, the memory controller continues to execute a read/write operation on the target memory bank based on the memory delay parameter. Specifically, a memory read/write process of software may specifically include the following operations: the memory controller sends a read/write command to the target memory bank through a signal line CMD; the target memory bank, after receiving the read/write command, waits for time corresponding to the memory delay parameter, and then feeds back a readable/writable state to the memory controller through a Ready signal; and the memory controller, after receiving the Ready signal, reads/writes data in the memory bank through a data line DATA.

As a possible implementation mode, the operation in the present embodiment that a hot-addition operation is executed on the target memory bank may include that: a level of a second GPIO pin is pulled down to add an address space where the target memory bank is located to an OS, so as to recover a state of the target memory bank to available.

According to the present embodiment, when the memory error quantity of the target memory bank in the memory error register is greater than the preset value, the memory delay parameter is recalculated, and the recalculated memory delay parameter is written into the memory controller, whereby the memory controller continues to execute the read/write operation on the target memory bank. The memory delay parameter is waiting time after the memory controller controls the target memory bank to receive a read/write command. However, practically needed waiting time after the target memory bank receives a read/write command changes under the influence of a temperature, a humidity, and a memory state. When the practically needed waiting time increases while the memory delay parameter in the memory controller remains unchanged, the memory error quantity may increase. Therefore, in the present embodiment, recalculating and setting the memory delay parameter may reduce memory read/write errors caused by inadequate waiting time to further reduce the memory read/write error rate.

As a further introduction to the embodiment corresponding to FIG. 1, after the operation in S104 that a hot-addition operation is executed on the target memory bank, the target memory bank receives a new read/write command sent by the memory controller, and feeds back a Ready signal to the memory controller after a time delay corresponding to the memory delay parameter, whereby the memory controller executes the read/write operation on the target memory bank after receiving the Ready signal.

Figure 2:
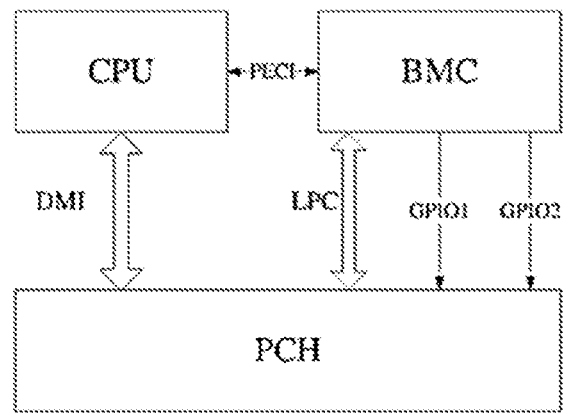
FIG. 2 is a structural diagram of a server according to an embodiment of the present application.

The flow described in the above-mentioned embodiment will be described below with an embodiment in a practical application. Referring to FIG. 2, FIG. 2 is a structural diagram of a server according to an embodiment of the present application. The present embodiment may include the following steps.

In step 1, an operation of calculating a memory delay parameter by MRC detection is sent to a Baseboard Management Controller (BMC) through a Lower Pin Count (LPC) bus in a boot process of a BIOS. Attributes of GPIO1 and GPIO2 are set to System Management Interrupt (SMI). GPIO1 is configured to notify an OS of memory hot-removal, and GPIO2 is configured to notify the OS of memory hot-addition.

SMI refers to System Management Interrupt, an interrupt under an X86 platform. LPC refers to Lower Pin Count, a data bus for communication between the BMC and a Platform Controller Hub (PCH). A Central Processing Unit (CPU) is connected with the PCH (integrated south bridge) through a Direct Media Interface (DMI).

In step 2, after the BIOS is booted, the OS is entered.

In step 3, the BMC periodically reads a memory error register through a PECI bus to detect Error Checking and Correcting (ECC) errors of a DDR4 memory in a server, and if there are ECC errors and a certain threshold quantity N is reached, triggers a hot-removal operation of a channel where the memory is located to remove an address space where the memory is located from the OS to make the address space unavailable.

In step 4, the BMC executes the "operation of calculating a memory delay parameter by MRC detection sent in the boot process of the BIOS" in step 2 to obtain a memory delay parameter.

In step 5, the BMC reads/writes a register of the memory controller through the PECI bus to set the memory delay parameter in the memory controller.

In step 6, the BMC triggers a hot-addition operation of the channel where the memory is located to add the address space where the memory is located to the OS.

The present embodiment proposes a solution for reducing the memory read/write error rate. When a memory parameter t is changed by an external factor, and a memory read/write error occurs, the BMC may automatically trigger a hot-removal operation of a channel where the memory is located, calculate a memory delay parameter, and set the memory delay parameter in the memory controller. Then, the BMC triggers a hot-addition operation of the channel where the memory is located to add an address space where the memory is located to the OS for the software to read/write the memory later based on the memory delay parameter. Therefore, the data read/write accuracy of the software is ensured, and the memory read/write error rate is reduced. In the present embodiment, the memory parameter may be set automatically without shutdown or reboot according to changes of an environmental condition, etc., whereby the memory read/write error rate of the software is reduced.

The memory delay parameter is different in case of different machines, memories, environmental temperatures, humidities, a practically needed delay may change due to temperature and humidity changes after the server operates for a period of times, and when the software in the OS reads/writes the memory, there may be brought an abnormal data read/write error if the memory controller still uses the original memory delay parameter. When the parameter t changes, and a memory read/write error occurs, in the present application, the BMC, when detecting that ECC errors of a certain DDR4 memory reach a certain threshold, triggers a hot-removal operation of a channel where the memory is located to remove an address space where the memory is located from the OS to make the address space unavailable, and the application software in the OS does not read/write the memory any more. Then, the BMC executes an operation of calculating a new memory delay parameter by MRC detection sent in a boot process of the BIOS to obtain a new memory delay parameter, and sets the new memory delay parameter in the memory controller. The BMC triggers a hot-addition operation of the channel where the memory is located to add the address space where the memory is located to the OS for the software to read/write the memory later based on the new memory delay parameter. Therefore, the data read/write accuracy of the software is ensured.

Figure 3:
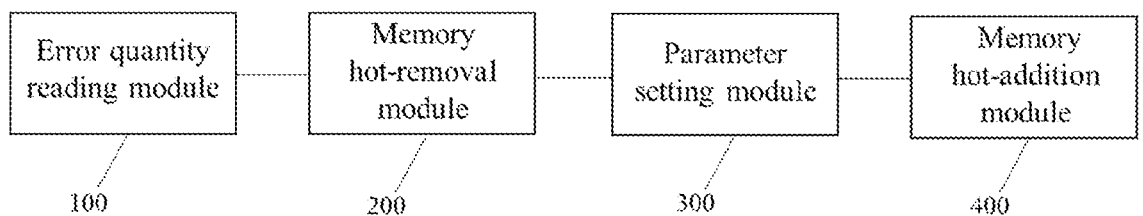
FIG. 3 is a schematic structural diagram of a memory anomaly processing system according to an embodiment of the present application.

Referring to FIG. 3, FIG. 3 is a schematic structural diagram of a memory anomaly processing system according to an embodiment of the present application.

The system may include:

an error quantity reading module 100, configured to read a memory error quantity of a target memory bank from a memory error register;

a memory hot-removal module 200, configured to, when the memory error quantity is greater than a preset value, execute a hot-removal operation on the target memory bank;

a parameter setting module 300, configured to calculate a memory delay parameter, and write the memory delay parameter into a memory controller, wherein the memory delay parameter is waiting time after the memory controller controls the target memory bank to receive a read/write command; and a memory hot-addition module 400, configured to execute a hot-addition operation on the target memory bank, whereby the memory controller continues to execute a read/write operation on the target memory bank based on the memory delay parameter.

According to the present embodiment, when the memory error quantity of the target memory bank in the memory error register is greater than the preset value, the memory delay parameter is recalculated, and the recalculated memory delay parameter is written into the memory controller, whereby the memory controller continues to execute the read/write operation on the target memory bank. The memory delay parameter is waiting time after the memory controller controls the target memory bank to receive a read/write command. However, practically needed waiting time after the target memory bank receives a read/write command changes under the influence of a temperature, a humidity, and a memory state. When the practically needed waiting time increases while the memory delay parameter in the memory controller remains unchanged, the memory error quantity may increase. Therefore, in the present embodiment, recalculating and setting the memory delay parameter may reduce memory read/write errors caused by inadequate waiting time to further reduce the memory read/write error rate.

Further, the system further includes:

a memory read/write module, configured to, after the hot-addition operation is executed on the target memory bank, by the target memory bank, receive a new read/write command sent by the memory controller, and feed back a Ready signal to the memory controller after a time delay corresponding to the memory delay parameter, whereby the memory controller executes the read/write operation on the target memory bank after receiving the Ready signal.

Further, the memory hot-removal module 200 is specifically configured to pull down a level of a first GPIO pin to remove an address space where the target memory bank is located from an OS, so as to set a state of the target memory bank to unavailable.

Further, the memory hot-addition module 400 is specifically configured to pull down a level of a second GPIO pin to add an address space where the target memory bank is located to an OS, so as to recover a state of the target memory bank to available.

Further, the parameter setting module 300 includes:

a parameter write unit, configured to read/write the memory controller through a PECI bus to write the memory delay parameter into a register of the memory controller.

Further, the target memory bank is a DDR4 memory bank or a DDR3 memory bank.

Further, the parameter setting module 300 includes:

a parameter calculation unit, configured to acquire an MRC in a boot process of a BIOS, and calculate the memory delay parameter according to the MRC.

The embodiment of the system part is in mutual correspondence with the embodiment of the method part. Therefore, the embodiment of the system part refers to the descriptions about the embodiment of the method part, and will not be elaborated temporarily herein.

The present application also provides a storage medium, having a computer program stored thereon which, when executed, may implement the steps provided in the above-mentioned embodiment. The storage medium may include various media capable of storing program codes such as a U disk, a mobile hard disk, a Read-Only Memory (ROM), a Random Access Memory (RAM), a magnetic disk, or an optical disk.

The present application also provides an electronic device, which may include a storage device and a processor. The storage device stores a computer program. The processor, when calling the computer program in the storage device, may implement the steps provided in the above-mentioned embodiment. Certainly, the electronic device may further include various network interfaces, a power supply, and other components.

All the embodiments in this specification are described in a progressive manner. Contents mainly described in each embodiment are different from those described in other embodiments. Same or similar parts of all the embodiments refer to each other. For the system disclosed in the embodiments, since it corresponds to the method disclosed in the embodiments, the description is relatively simple, and the relevant part can be referred to the description of the method part. It should be noted that for a person of ordinary skill in the art, several improvements and modifications can be made to the present application without departing from the principle of the present application, and these improvements and modifications also fall within the scope of protection of the claims of the present application.

It is also noted that in this specification, relationship terms such as first and second are used only to distinguish one entity or operation from another entity or operation, without necessarily requiring or implying any such actual relationship or order between those entities or operations. Further, the terms "include" "comprise" or any other variation thereof are intended to cover non-exclusive inclusion, so that a process, method, article, or apparatus that includes a set of elements includes not only those elements, but also other elements not expressly listed, or also include elements that are inherent to such process, method, article, or apparatus. With no more restrictions, an element defined by statement "including a/an" does not exclude the existence of the same other elements in a process, method, object, or device including the element.

What is claimed is:

1. A memory anomaly processing method, comprising:
  reading a memory error quantity of a target memory bank from a memory error register;
  in response to determining that the memory error quantity is greater than a preset value, executing a hot-removal operation on the target memory bank;
  calculating a memory delay parameter, and writing the memory delay parameter into a memory controller, wherein the memory delay parameter is waiting time after the memory controller controls the target memory bank to receive a read/write command; and
  executing a hot-addition operation on the target memory bank, whereby the memory controller continues to execute a read/write operation on the target memory bank based on the memory delay parameter;
  wherein the executing a hot-removal operation on the target memory bank comprises:
    pulling down a level of a first General Purpose Input/Output (GPIO) pin to remove an address space where the target memory bank is located from an Operating System (OS), so as to set a state of the target memory bank to unavailable.

2. The processing method according to claim 1, wherein after the executing a hot-addition operation on the target memory bank, the method further comprises:
  by the target memory bank, receiving a new read/write command sent by the memory controller, and feeding back a Ready signal to the memory controller after a time delay corresponding to the memory delay parameter, whereby the memory controller executes the read/write operation on the target memory bank after receiving the Ready signal.

3. The processing method according to claim 1, wherein the executing a hot-addition operation on the target memory bank comprises:
pulling down a level of a second GPIO pin to add the address space where the target memory bank is located to the OS, so as to recover the state of the target memory bank to available.

4. The processing method according to claim 1, wherein the writing the memory delay parameter into a memory controller comprises:
reading/writing the memory controller through a Platform Environment Control Interface (PECI) bus to write the memory delay parameter into a register of the memory controller.

5. The processing method according to claim 1, wherein the target memory bank is a Double Data Rate 4 (DDR4) memory bank or a Double Data Rate 3 (DDR3) memory bank.

6. The processing method according to claim 1, wherein the calculating a memory delay parameter comprises:
acquiring a Memory Reference Code (MRC) in a boot process of a Basic Input/Output System (BIOS), and calculating the memory delay parameter according to the MRC.

7. An electronic device, comprising a storage device and a processor, wherein the storage device stores a computer program, and the processor calls the computer program in the storage device to implement a memory anomaly processing method;
wherein the memory anomaly processing method comprises:
reading a memory error quantity of a target memory bank from a memory error register;
in response to determining that the memory error quantity is greater than a preset value, executing a hot-removal operation on the target memory bank;
calculating a memory delay parameter, and writing the memory delay parameter into a memory controller, wherein the memory delay parameter is waiting time after the memory controller controls the target memory bank to receive a read/write command; and
executing a hot-addition operation on the target memory bank, whereby the memory controller continues to execute a read/write operation on the target memory bank based on the memory delay parameter;
wherein the executing a hot-removal operation on the target memory bank comprises:
pulling down a level of a first General Purpose Input/Output (GPIO) pin to remove an address space where the target memory bank is located from an Operating System (OS), so as to set a state of the target memory bank to unavailable.

8. The electronic device according to claim 7, wherein after the executing a hot-addition operation on the target memory bank, the method further comprises:
by the target memory bank, receiving a new read/write command sent by the memory controller, and feeding back a Ready signal to the memory controller after a time delay corresponding to the memory delay parameter, whereby the memory controller executes the read/write operation on the target memory bank after receiving the Ready signal.

9. The electronic device according to claim 7, wherein the executing a hot-addition operation on the target memory bank comprises:
pulling down a level of a second GPIO pin to add the address space where the target memory bank is located to the OS, so as to recover the state of the target memory bank to available.

10. The electronic device according to claim 7, wherein the writing the memory delay parameter into a memory controller comprises:
reading/writing the memory controller through a Platform Environment Control Interface (PECI) bus to write the memory delay parameter into a register of the memory controller.

11. The electronic device according to claim 7, wherein the target memory bank is a Double Data Rate 4 (DDR4) memory bank or a Double Data Rate 3 (DDR3) memory bank.

12. The electronic device according to claim 7, wherein the calculating a memory delay parameter comprises:
acquiring a Memory Reference Code (MRC) in a boot process of a Basic Input/Output System (BIOS), and calculating the memory delay parameter according to the MRC.

13. A non-transitory computer readable storage medium storing computer-executable instructions which when loaded and executed by a processor implement a memory anomaly processing method;
wherein the memory anomaly processing method comprises:
reading a memory error quantity of a target memory bank from a memory error register;
in response to determining that the memory error quantity is greater than a preset value, executing a hot-removal operation on the target memory bank;
calculating a memory delay parameter, and writing the memory delay parameter into a memory controller, wherein the memory delay parameter is waiting time after the memory controller controls the target memory bank to receive a read/write command; and
executing a hot-addition operation on the target memory bank, whereby the memory controller continues to execute a read/write operation on the target memory bank based on the memory delay parameter;
wherein the executing a hot-removal operation on the target memory bank comprises:
pulling down a level of a first General Purpose Input/Output (GPIO) pin to remove an address space where the target memory bank is located from an Operating System (OS), so as to set a state of the target memory bank to unavailable.

14. The non-transitory computer readable storage medium according to claim 13, wherein after the executing a hot-addition operation on the target memory bank, the method further comprises:
by the target memory bank, receiving a new read/write command sent by the memory controller, and feeding back a Ready signal to the memory controller after a time delay corresponding to the memory delay parameter, whereby the memory controller executes the read/write operation on the target memory bank after receiving the Ready signal.

15. The non-transitory computer readable storage medium according to claim 13, wherein the executing a hot-addition operation on the target memory bank comprises:

pulling down a level of a second GPIO pin to add the address space where the target memory bank is located to the OS, so as to recover the state of the target memory bank to available.

16. The non-transitory computer readable storage medium according to claim 13, wherein the writing the memory delay parameter into a memory controller comprises:

reading/writing the memory controller through a Platform Environment Control Interface (PECI) bus to write the memory delay parameter into a register of the memory controller.

17. The non-transitory computer readable storage medium according to claim 13, wherein the calculating a memory delay parameter comprises:

acquiring a Memory Reference Code (MRC) in a boot process of a Basic Input/Output System (BIOS), and calculating the memory delay parameter according to the MRC.

\* \* \* \* \*